(12) United States Patent
Yoon et al.

(10) Patent No.: US 10,573,786 B2
(45) Date of Patent: Feb. 25, 2020

(54) SEMICONDUCTOR LIGHT EMITTING DEVICE

(71) Applicant: Samsung Electronics Co., Ltd., Suwon-si, Gyeonggi-do (KR)

(72) Inventors: Ju Heon Yoon, Seoul (KR); Tae Hun Kim, Bucheon-si (KR); Jae In Sim, Yongin-si (KR)

(73) Assignee: SAMSUNG ELECTRONICS CO., LTD., Suwon-si, Gyeonggi-do (KR)

(*) Notice: Subject to any disclaimer, the term of this patent is extended or adjusted under 35 U.S.C. 154(b) by 0 days.

(21) Appl. No.: 16/055,651

(22) Filed: Aug. 6, 2018

(65) Prior Publication Data
US 2019/0237626 A1 Aug. 1, 2019

(30) Foreign Application Priority Data

Jan. 26, 2018 (KR) .................. 10-2018-0010192

(51) Int. Cl.
| | |
|---|---|
| H01L 33/00 | (2010.01) |
| H01L 33/40 | (2010.01) |
| H01L 33/62 | (2010.01) |
| H01L 33/46 | (2010.01) |
| H01L 33/52 | (2010.01) |
| H01L 33/42 | (2010.01) |
| H01L 23/00 | (2006.01) |

(52) U.S. Cl.
CPC ............ *H01L 33/405* (2013.01); *H01L 33/42* (2013.01); *H01L 33/46* (2013.01); *H01L 33/52* (2013.01); *H01L 33/62* (2013.01); *H01L 24/17* (2013.01)

(58) Field of Classification Search
CPC ....................................... H01L 33/405
USPC ............................................ 257/98
See application file for complete search history.

(56) References Cited

U.S. PATENT DOCUMENTS

| | | | |
|---|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,784,462 B2 | 8/2004 | Schubert |
| 6,818,465 B2 | 11/2004 | Biwa et al. |
| 6,818,530 B2 | 11/2004 | Shimoda et al. |
| 6,858,081 B2 | 2/2005 | Biwa et al. |

(Continued)

FOREIGN PATENT DOCUMENTS

| | | |
|---|---|---|
| KR | 10-2008-0017947 A | 2/2008 |
| KR | 10-2011-0119930 A | 11/2011 |
| KR | 20110119930 A * | 11/2011 |

*Primary Examiner* — Ajay Arora
(74) *Attorney, Agent, or Firm* — Lee IP Law, P.C.

(57) ABSTRACT

A semiconductor light emitting device includes: a light emitting structure having a first conductivity-type semiconductor layer, an active layer, and a second conductivity-type semiconductor layer stacked therein along a stacking direction, a transparent electrode layer on the second conductivity-type semiconductor layer and divided into first and second regions, the transparent electrode layer having a plurality of first through-holes disposed in the first region, an insulating reflective layer covering the transparent electrode layer and having a plurality of second through-holes in a region overlapping the second region along the stacking direction, and a reflective electrode layer on the region of the insulating reflective layer and connected to the transparent electrode layer through the plurality of second through-holes.

20 Claims, 20 Drawing Sheets

A2

(56) References Cited

U.S. PATENT DOCUMENTS

| | | |
|---|---|---|
| 6,869,820 B2 | 3/2005 | Chen |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,119,372 B2 | 10/2006 | Stokes et al. |
| 7,154,124 B2 | 12/2006 | Han et al. |
| 7,166,483 B2 | 1/2007 | Liu et al. |
| 7,208,725 B2 | 4/2007 | Sherrer et al. |
| 7,288,758 B2 | 10/2007 | Sherrer et al. |
| 7,291,865 B2 | 11/2007 | Kojima et al. |
| 7,319,044 B2 | 1/2008 | Han et al. |
| 7,375,380 B2 | 5/2008 | Asahara et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,846,755 B2 | 12/2010 | Kal et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 7,998,761 B2 | 8/2011 | Kim et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,143,636 B2 | 3/2012 | Lin et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,546,818 B2 | 10/2013 | Liu et al. |
| 8,637,886 B2 | 1/2014 | Tsuji |
| 8,735,931 B2 | 5/2014 | Han et al. |
| 8,766,295 B2 | 7/2014 | Kim |
| 8,772,804 B2 | 7/2014 | Ahlstedt et al. |
| 8,823,031 B2 | 9/2014 | Kususe et al. |
| 9,472,718 B2 | 10/2016 | Hodota |
| 9,559,264 B2 | 1/2017 | Lim et al. |
| 2006/0071226 A1 * | 4/2006 | Kojima ............... H01L 33/405 257/98 |
| 2008/0173885 A1 | 7/2008 | Kuromizu |
| 2008/0217634 A1 | 9/2008 | Liu et al. |
| 2010/0166983 A1 | 7/2010 | Cho et al. |
| 2010/0327300 A1 | 12/2010 | Epler et al. |
| 2012/0241718 A1 | 9/2012 | Chen et al. |
| 2013/0069095 A1 | 3/2013 | Hodota |
| 2014/0209960 A1 | 7/2014 | Park et al. |
| 2017/0108173 A1 | 4/2017 | Kim et al. |
| 2017/0133549 A1 | 5/2017 | Xu et al. |
| 2017/0155018 A1 | 6/2017 | Kuo et al. |
| 2017/0236979 A1 | 8/2017 | Seo et al. |
| 2017/0263816 A1 | 9/2017 | Yang et al. |
| 2017/0365745 A1 | 12/2017 | Yang et al. |

* cited by examiner

SEMICONDUCTOR LIGHT EMITTING DEVICE

CROSS-REFERENCE TO RELATED APPLICATION

Korean Patent Application No. 10-2018-0010192 filed on Jan. 26, 2018, with the Korean Intellectual Property Office, and entitled: "Semiconductor Light Emitting Device," is incorporated by reference herein in its entirety.

BACKGROUND

1. Field

Embodiments relate to a semiconductor light emitting device.

2. Description of the Related Art

Light emitting diodes (LEDs), devices containing light emitting materials therein to emit light, convert energy generated due to the recombination of electrons and holes into light to be emitted therefrom. Such LEDs are in widespread use in lighting elements, display devices, and light sources.

SUMMARY

According to an embodiment, a semiconductor light emitting device includes: a light emitting structure having a first conductivity-type semiconductor layer, an active layer, and a second conductivity-type semiconductor layer stacked therein, a transparent electrode layer disposed on the second conductivity-type semiconductor layer and divided into first and second regions, the transparent electrode layer having a plurality of first through-holes disposed in the first region, an insulating reflective layer covering the transparent electrode layer and having a plurality of second through-holes disposed in a region overlapping the second region, and a reflective electrode layer disposed on one region of the insulating reflective layer and connected to the transparent electrode layer through the plurality of second through-holes.

According to an embodiment, a semiconductor light emitting device includes: a light emitting structure having a first conductivity-type semiconductor layer, an active layer, and a second conductivity-type semiconductor layer stacked therein, a transparent electrode layer disposed on the second conductivity-type semiconductor layer and divided into first and second regions, the transparent electrode layer having a plurality of first through-holes disposed in the first region, a first insulating reflective layer passing through the plurality of first through-holes to contact the second conductivity-type semiconductor layer and having a plurality of second through-holes disposed in a region overlapping the second region, and a reflective electrode layer covering the insulating reflective layer and connected to the transparent electrode layer through the plurality of second through-holes.

According to an embodiment, a semiconductor light emitting device includes: a substrate, a light emitting structure having a first conductivity-type semiconductor layer, an active layer, and a second conductivity-type semiconductor layer stacked on the substrate, a transparent electrode layer disposed on the second conductivity-type semiconductor layer and divided into first and second regions, the transparent electrode layer having a plurality of first through-holes disposed in the first region, a first insulating reflective layer penetrating through the plurality of first through-holes to contact the second conductivity-type semiconductor layer and having a plurality of second through-holes disposed in a region overlapping the second region, a reflective electrode layer covering the insulating reflective layer and connected to the transparent electrode layer through the plurality of second through-holes, a second insulating reflective layer covering the first and second electrodes, and first and second conductive patterns disposed on the second insulating reflective layer and connected to the first conductivity-type semiconductor layer and the reflective electrode layer, respectively, through the second insulating reflective layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
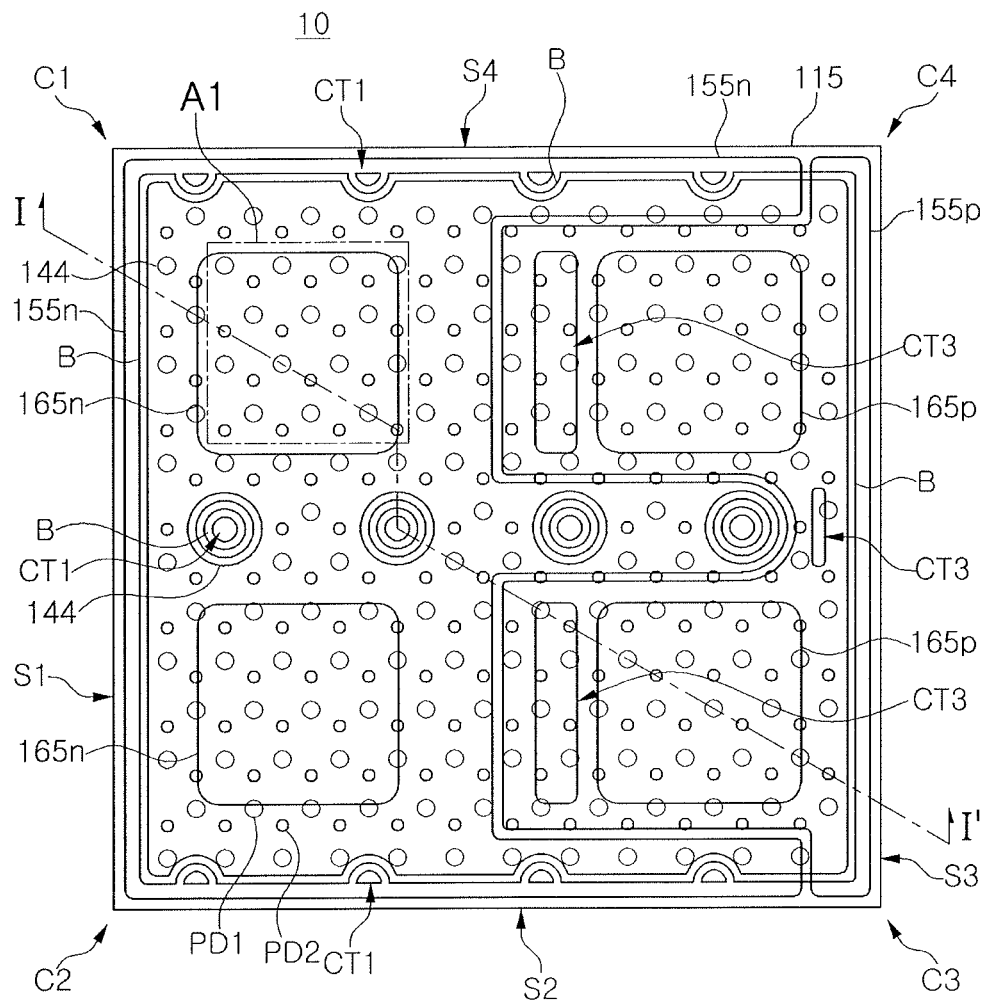
FIG. 1 illustrates a schematic plan view of a semiconductor light emitting device according to an exemplary embodiment.
Figure 2:
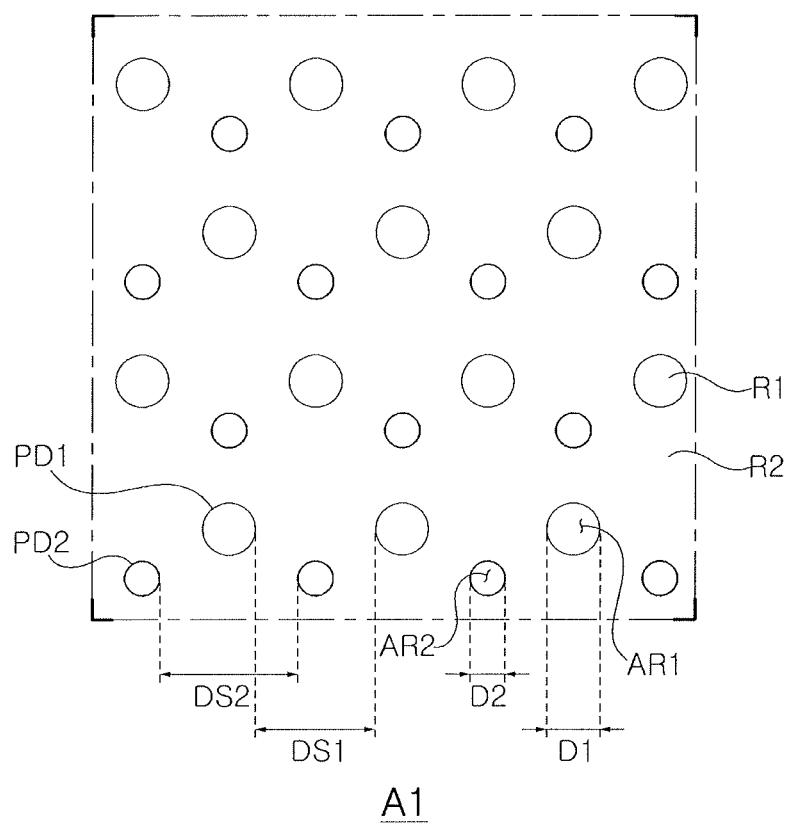
FIG. 2 illustrates an enlarged view of portion A1 of FIG. 1.
Figure 3:
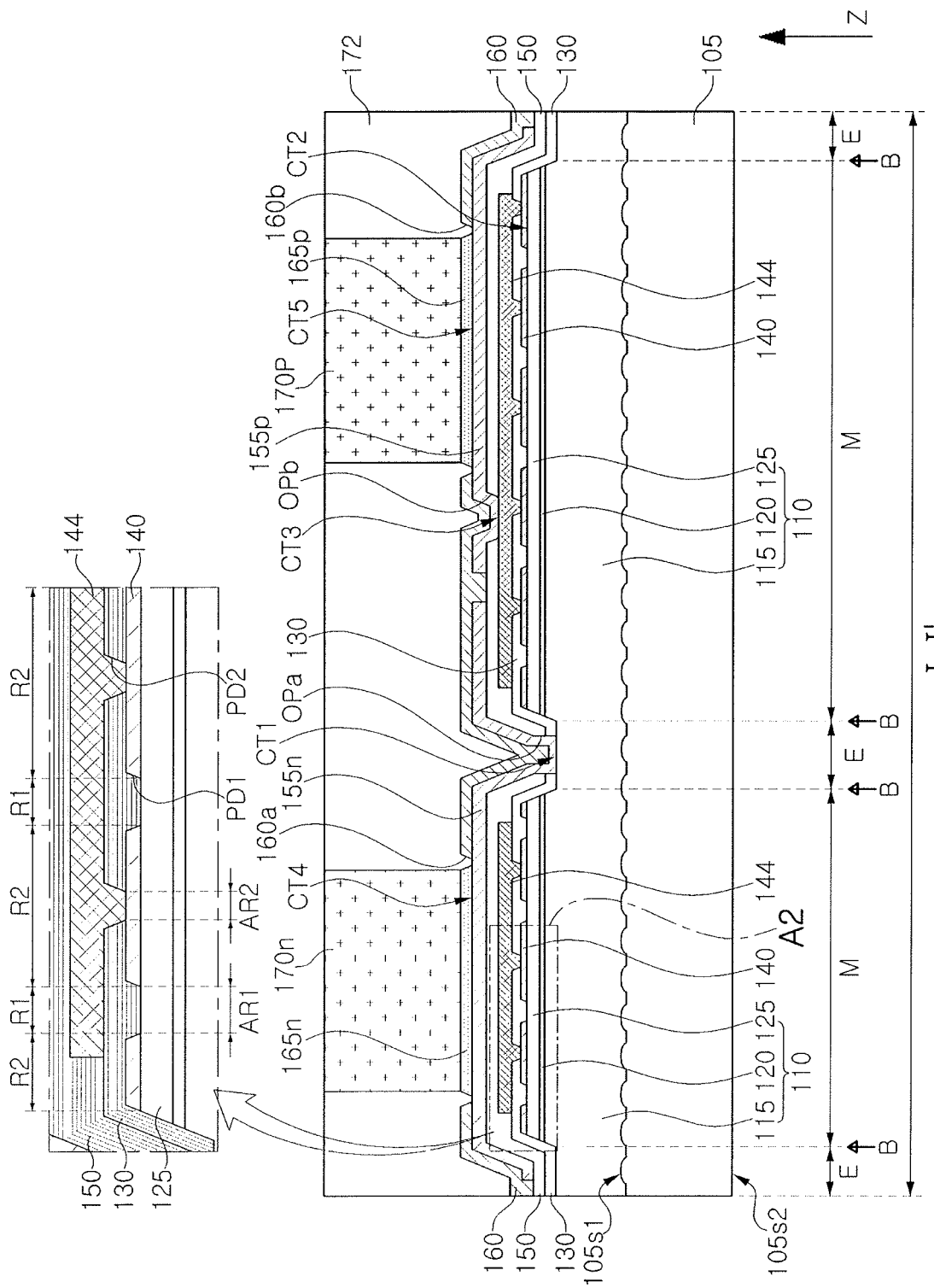
FIG. 3 illustrates a side cross-sectional view of the semiconductor light emitting device of FIG. 1, taken along line I-I'.

A semiconductor light emitting device 10 according to an example embodiment will be described with reference to FIGS. 1 to 3. FIG. 1 is a schematic plan view of a semiconductor light emitting device according to an example embodiment. FIG. 2 is an enlarged view of portion A1 of FIG. 1. FIG. 3 is a side cross-sectional view of the semiconductor light emitting device of FIG. 1, taken along line I-I'.

The semiconductor light emitting device 10 according to an embodiment may include a substrate 105, a light emitting structure 110, a transparent electrode layer 140, first and second insulating reflective layers 130 and 150, a reflective electrode layer 144, first and second conductive patterns 155$n$ and 155$p$, a passivation layer 160, first and second solder bumps 170$n$ and 170$p$, and a molded portion 172. The light emitting structure 110 may be on the front surface 105$s$1 of the substrate 105.

The substrate 105 may have a front surface 105$s$1 and a rear surface 105$s$2 opposing the front surface 105$s$1. The substrate 105 may be a substrate for growing a semiconductor and may be formed of an insulating, conductive, or semiconductor material such as sapphire, Si, SiC, $MgAl_2O_4$, MgO, $LiAlO_2$, $LiGaO_2$, GaN or the like. The sapphire is electrically insulating, may be a crystal having hexagonal-rhombo (Hexa-Rhombo R3c) symmetry and may be used as a substrate for growing a nitride semiconductor.

Throughout the specification, terms such as "front surface" and "rear surface" are used for distinguishing relative positions of components. Accordingly, terms such as "front surface" and "rear surface" may be replaced by other terms such as "first surface" and "second surface" or "top surface" and "bottom surface", and may be used to describe components of the specification. The front surface $105s1$ and the rear surface $105s2$ of the substrate 105 may be replaced by a top surface $105s1$ and a bottom surface $105s2$ of the substrate 105 or may be replaced by a first surface $105s1$ and a second surface $105s2$ of the substrate 105.

In one example, the front surface $105s1$ of the substrate 105 may have an uneven structure that may improve external light extraction efficiency and crystallinity of semiconductor layers constituting the light emitting structure 110. In the embodiment, the uneven structure of the front surface $105s1$ of the substrate 105 is exemplified as having a dome-shaped convex shape. Alternatively, the uneven structure of the front surface $105s1$ of the substrate 105 may be formed in various shapes, e.g., a square shape, a triangular shape or the like. In addition, the uneven structure of the front surface $105s1$ of the substrate 105 may be selectively formed at various regions or may be omitted.

In one example, the substrate 105 may later be removed, depending on embodiments. For example, the substrate 105 may be provided as a growth substrate for growing the light emitting structure 110, and may then be removed through a separation process. The substrate 105 may be separated from the light emitting structure 110 by a method, e.g., a laser lift off (LLO) method, a chemical lift off (CLO) method, or the like.

The light emitting structure 110 may include a first conductivity-type semiconductor layer 115, an active layer 120, and a second conductivity-type semiconductor layer 125. The first conductivity-type semiconductor layer 115 may be grown from the front surface $105s1$ of the substrate 105. The first conductivity-type semiconductor layer 115 may be formed of a semiconductor doped with an n-type impurity or may be an n-type nitride semiconductor layer.

When viewed in plan view, the first conductivity-type semiconductor layer 115 may have a quadrangular shape. When viewed in plan view, the first conductivity-type semiconductor layer 115 may have a first corner C1, a second corner C2, a third corner C3, and a fourth corner C4, which are sequentially arranged in a counterclockwise direction. When viewed in plan view, the first conductivity-type semiconductor layer 115 may have a first edge S1 between the first corner C1 and the second corner C2, a second edge S2 between the second corner C2 and the third corner C3, a third edge S3 between the third corner C3 and the fourth corner C4, and a fourth edge S4 between the first corner C1 and the fourth corner C4. Thus, the first and third edges S1 and S3 may face each other, and the second and fourth edges S2 and S4 may face each other.

In one example, when viewed in plan view, the first conductivity-type semiconductor layer 115 may be self-aligned on the substrate 105, so that the first to fourth corners C1 to C4 and the first to fourth edges S1 to S4 of the first conductivity-type semiconductor layer 115 may be applied to the substrate 105 in the same manner.

The first conductivity-type semiconductor layer 115 may have a recess region E and a protrusion region M. The recess region E may be referred to as an etch region, and the protrusion region M may be referred to as a mesa region. In the drawings, reference numeral "B" may indicate a boundary B between the recess region E and the protrusion region M. In the first conductivity-type semiconductor layer 115, an upper surface of the protrusion region M may be higher than an upper surface of the recess region E.

In one example, the protrusion region M may be gradually narrowed in an upward direction. Therefore, the protrusion region M may have a sloped side surface. In one example, a portion of the upper surface of the recess region E may be defined as a first contact region CT1. In one example, at least a portion of the upper surface of the protrusion region M may be defined as a second contact region CT2.

Throughout the specification, terms such as "first", "second" and the like may be used to describe various components, but the components are not limited by the terms. The terms are used only for the purpose of distinguishing one component from another component. For example, a "first component" may be termed a "second component" without departing from the scope of the present disclosure.

In the first conductivity-type semiconductor layer 115, the protrusion region M may be spaced apart from the first to fourth edges S1 to S4, and the recess region E may be disposed among the first to fourth edges S1 to S4. When viewed in plan view, the recess region E may extend in a direction from a portion of the first edge S1 toward the third edge S3, e.g., diagonally.

The active layer 120 and the second conductivity-type semiconductor layer 125 may be sequentially stacked on the upper surface of the protrusion region M of the first conductivity-type semiconductor layer 115. The second conductivity-type semiconductor layer 125 may be formed of a semiconductor doped with a p-type impurity and may be a p-type nitride semiconductor layer.

In one example, the first and second conductivity-type semiconductor layers 115 and 125 may be stacked with their positions being changed according to embodiments. The first and second conductivity-type semiconductor layers 115 and 125 may have a composition of $Al_xIn_yGa_{(1-x-y)}N$ (here, $0 \leq x < 1$, $0 \leq y < 1$, $0 \leq x+y < 1$) and may be, for example, materials such as GaN, AlGaN, InGaN, and AlInGaN.

The active layer 120 may be between the first and second conductivity-type semiconductor layers 115 and 125. The active layer 120 may emit light having a predetermined energy by recombination of electrons and holes when the semiconductor light emitting device 10 operates. The active layer 120 may contain a material having an energy band gap smaller than an energy band gap of the first and second conductivity-type semiconductor layers 115 and 125. For example, when the first and second conductivity-type semiconductor layers 115 and 125 are GaN-based compound semiconductors, the active layer 120 may include an InGaN-based compound semiconductor having an energy band gap smaller than the energy band gap of GaN. In addition, the active layer 120 may be a multiple quantum well (MQW) structure in which a quantum well layer and a quantum barrier layer are alternately stacked, for example, an InGaN/GaN structure. The structure of the active layer 120 may also be a single quantum well (SQW) structure.

A transparent electrode layer 140 may be on an upper surface of the second conductivity-type semiconductor layer 125. The transparent electrode layer 140 is formed of a conductive, light-transmissive material. The transparent electrode layer 140 may diffuse a current injected from the reflective electrode layer 144 to prevent the current from concentrating in one region of the second conductivity-type semiconductor layer 125. The transparent electrode layer 140 may cover all or a portion of the second conductivity-type semiconductor layer 125 overall. The transparent electrode layer 140 may be formed of a TCO (Transparent Conductive Oxide) material such as ITO (Indium Tin Oxide), ZITO (Zinc-doped Indium Tin Oxide), ZIO (Zinc Indium Oxide), GIO (Gallium Indium Oxide), ZTO (Zinc TinOxide), FTO (Fluorine-doped Tin Oxide), AZO (Aluminium-doped Zinc Oxide), GZO (Gallium-doped Zinc Oxide), $In_4Sn_3O_{12}$, $Zn_{(1-x)}Mg_xO$ (Zinc Magnesium Oxide, $0 \le x \le 1$), and the like. The transparent electrode layer 140 may be formed of a light-transmissive polymer resin having conductivity by containing at least one of an Ag nanowire and a carbon nanotube (CNT).

Referring to FIGS. 1 and 2, the transparent electrode layer 140 may include a first region R1, a region having a plurality of first through-holes PD1 formed therein, and a second region R2, a region other than the first region R1. When viewed from an upper surface of the semiconductor light emitting device 10, the transparent electrode layer 140 may be formed such that the plurality of first through-holes PD1 are arranged at regular intervals. The shapes and arrangements of the first through-holes PD1 may be variously modified. The first through-holes PD1 may be formed in various shapes, e.g., circular shapes or polygonal shapes, and may be arranged in a lattice manner or may be alternately arranged.

The transparent electrode layer 140 efficiently diffuses a current Is into the second conductivity-type semiconductor layer 125. However, since a certain portion of light is absorbed in a process of transmitting light emitted from the active layer 120, the transparent electrode layer 140 may reduce external light extraction efficiency, as compared to using a highly reflective layer as the electrode layer. In one example, the first through-holes PD1 may be formed by removing a portion of the transparent electrode layer 140, whereby the amount of light absorbed by the transparent electrode layer 140 may be reduced while current diffusion effects of the transparent electrode layer 140 are maintained.

A first insulating reflective layer 130 may be on the transparent electrode layer 140. The first insulating reflective layer 130 may cover the transparent electrode layer 140 and may fill the first through-holes PD1. The second through-holes PD2 may be in the first insulating reflective layer 130 in the second region R2 and do not overlap the first through-holes PD1 along a stacking or z-direction. The first insulating reflective layer 130 may cover a portion of the first conductivity-type semiconductor layer 115 and a portion of the second conductivity-type semiconductor layer 125. The first insulating reflective layer 130 may include a first opening OPa exposing the first contact region CT1 of the recess region E of the first conductivity-type semiconductor layer 115.

The first insulating reflective layer 130 is a reflective structure for reflecting light directed in a direction opposite to the substrate 105 among the light emitted from the active layer 120 and redirecting the light toward the substrate 105.

The first insulating reflective layer 130 may include a multilayer structure. The multilayer structure may have a structure in which a first insulating layer and a second insulating layer, which have different refractive indexes, are alternately stacked. That is, the first insulating reflective layer 130 may be a distributed Bragg reflector (DBR). The first insulating reflective layer 130 may be basically formed of a material having insulating properties and light transmitting properties, and may be formed using an inorganic material or an organic material. The first insulating reflective layer 130 may contain a silicon oxide or a silicon nitride having insulating properties and light transmitting properties. For example, the first insulating reflective layer 130 may be formed of S $SiO_2$, SiN, $SiO_xN_y$, $TiO_2$, $Si_3N_4$, $Al_2O_3$, TiN, AlN, $ZrO_2$, TiAlN, TiSiN or the like.

According to an embodiment, the first insulating reflective layer 130, together with the reflective electrode layer 144 on an upper portion of the first insulating reflective layer 130 in contact therewith, may form an omnidirectional reflector (ODR).

Figure 5:
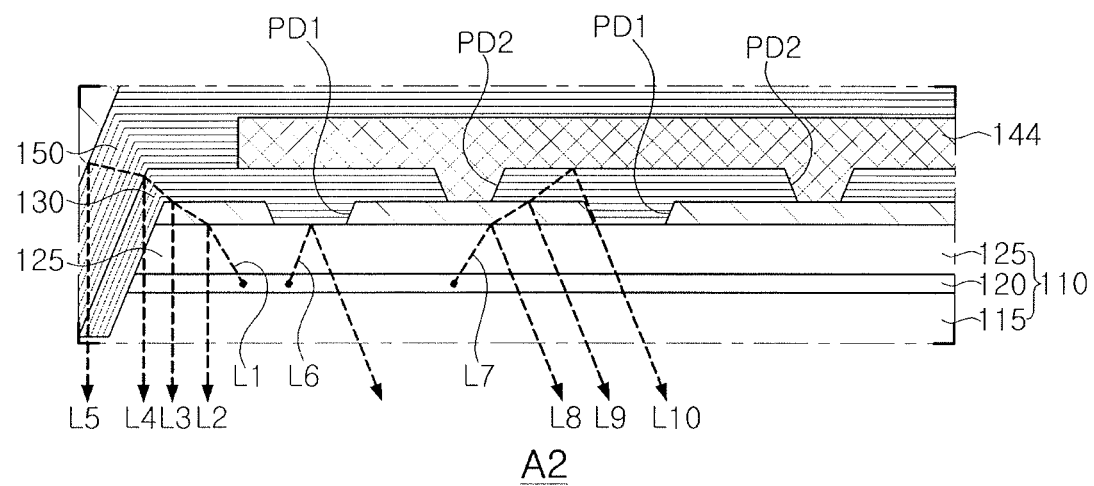
FIG. 5 illustrates a view illustrating effects of enhancing external light extraction of a semiconductor light emitting device according to an exemplary embodiment.

Referring to FIG. 5, the first insulating reflective layer 130 fills the first through-holes PD1, whereby the light L6 emitted from the active layer 120 may be reflected without being absorbed into the transparent electrode layer 140. Therefore, reflectivity may be improved overall to increase external light extraction efficiency.

Referring to FIG. 2, the first and second through-holes PD1 and PD2 are compared with each other. The first through-holes PD1 are formed in the first region R1 of the transparent electrode layer 140 while the second through-holes PD2 are formed in the first insulating reflective layer 130 and may be provided in the second region R2 of the transparent electrode layer 140. Therefore, the first and second through-holes PD1 and PD2 may be arranged so as not to overlap each other along the stacking direction. The first through-holes PD1 may be arranged to have a maximum size within a range in which current diffusion of the transparent electrode layer 140 is not hindered. Since reflectivity is improved in accordance with an increase in an area in which the first insulating reflective layer 130 and the reflective electrode layer 144 are in contact with each other, the second through-holes PD2 may be arranged to have a minimum size within a range in which reflectivity is not hindered. Therefore, in one embodiment, a size D1 of the first through-holes PD1 is relatively large and a size D2 of the second through-holes PD2 relatively small, i.e., the size D1 of the first through-holes PD1 is formed larger than the size D2 of the second through-holes PD2, external light extraction efficiency may be improved without hindering current diffusion effects of the transparent electrode layer 140.

Figure 4:
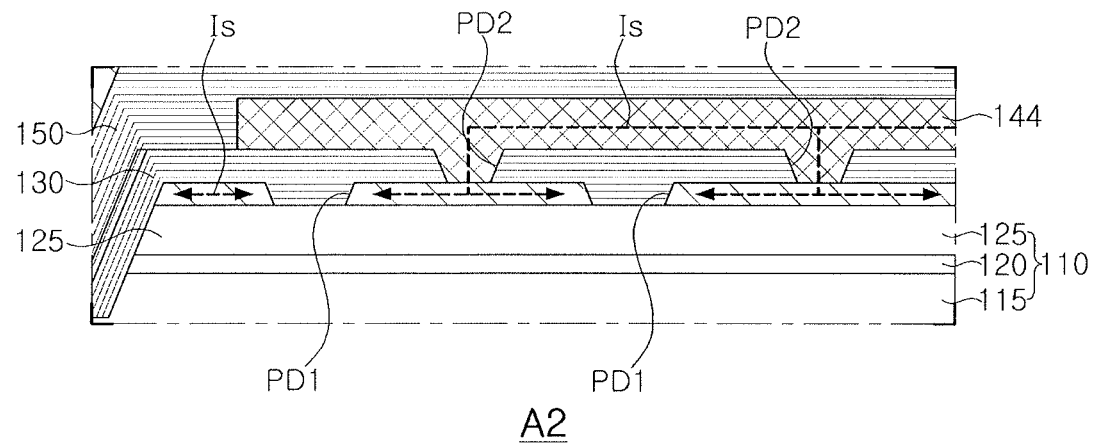
FIG. 4 illustrates a view of current diffusion effects of a semiconductor light emitting device according to an exemplary embodiment.

The reflective electrode layer 144 is on the first insulating reflective layer 130 and fills the second through-holes PD2. Accordingly, the reflective electrode layer 144 may penetrate through the first insulating reflective layer 130 and may be connected to the transparent electrode layer 140. The reflective electrode layer 144 may be formed of a single layer or a multilayer structure of a conductive material having ohmic characteristics with the transparent electrode layer 140, and may be formed of a material containing one or more of Au, W, Pt, Si, Ir, Ag, Cu, Ni, Ti, Cr, alloys thereof, and the like. Therefore, as shown in FIG. 4, the current Is applied to the reflective electrode layer 144 may be diffused through the transparent electrode layer 140.

Generally, a flip chip-type semiconductor light emitting device emits light generated by the active layer 120 in a direction towards the substrate 101. When light is emitted away from the substrate, light may be incident on and absorbed by the transparent electrode layer 140 in a considerable amount, resulting in loss of light. In order to solve such defects in which light is absorbed into the transparent electrode layer 140, thereby degrading luminance, in this embodiment, the first through-holes PD1 may be formed in the transparent electrode layer 140, and the first through-holes PD1 may be filled with the first insulating reflective layer 130 having higher reflectivity to improve reflectivity. In addition, the second through-holes PD2 of the first insulating reflective layer 130 are arranged so as not to overlap the first through-holes PD1 along the z-direction, such that an area where the first insulating reflective layer 130 and the reflective electrode layer 144 overlap each other may be increased. Therefore, reflectivity may be improved as compared with a case where the first insulating reflective layer 130 is simply disposed or the first and second through-holes PD1 and PD2 overlap each other along the z-direction. Therefore, external light extraction efficiency of the semiconductor light emitting device 10 may be further improved.

The second insulating reflective layer 150 may be on the reflective electrode layer 144 and the first insulating reflective layer 130 to further enhance the external light extraction efficiency. The second insulating reflective layer 150 may be formed of the same material as the first insulating reflective layer 130. In some embodiments, the second insulating reflective layer 150 may form a distributed Bragg reflector (DBR). The second insulating reflective layer 150 may reflect a portion L5 of the light passing through the transparent electrode layer 140 to further improve the external light extraction efficiency. The second insulating reflective layer 150 may include a first opening OPa exposing the first contact region CT1 of the first conductivity-type semiconductor layer 115 and a second opening OPa exposing a third contact region CT3 of the reflective electrode layer 144.

The first conductive pattern 155n and the second conductive pattern 155p may be on the second insulating reflective layer 150, may be formed of the same material, and are spaced apart from each other. For example, the first conductive pattern 155n and the second conductive pattern 155p may be formed of a material containing one or more of Au, W, Pt, Si, Ir, Ag, Cu, Ni, Ti, Cr and alloys thereof.

The first conductive pattern 155n may extend to the first contact region CT1 of the first conductivity-type semiconductor layer 115 to be electrically connected to the first conductivity-type semiconductor layer 115. The second conductive pattern 155p may extend to the third contact region CT3 of the reflective electrode layer 144 which, in turn, is electrically connected to the second conductivity-type semiconductor layer 125. When viewed in plan view, the first conductive pattern 155n may be adjacent to the first edge S1, the second edge S2, and the fourth edge S4, and the second conductive pattern 155p may be adjacent to the third edge S3.

Figure 6:
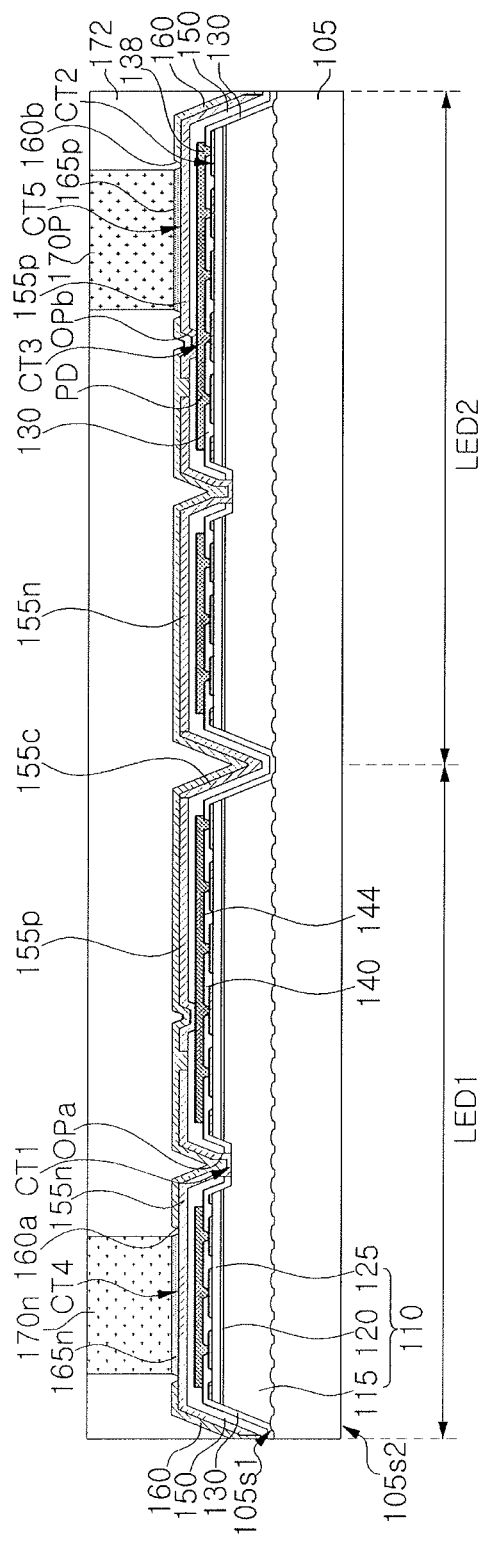
FIG. 6 illustrates another embodiment.

FIG. 6 shows another embodiment in which a plurality of light emitting structures LED1 and LED2 share one substrate 105 and are connected in series by an interconnecting portion 155c. The description of components to which the same reference numerals as the previous embodiment described above are assigned will be omitted.

As in one example, when the plurality of light emitting structures LED1 and LED2 are formed, a first or second conductive pattern of one light emitting structure LED1 may be electrically connected in series to a first or second conductive pattern of the other light emitting structure LED2 by the interconnecting portion 155c. In one example, the second conductive pattern 155p of one light emitting structure LED1 and the first conductive pattern 155n of the other light emitting structure LED2 are connected by the interconnecting portion 155c.

Next, an example of a method of manufacturing the semiconductor light emitting device 10 according to one embodiment will be described with reference to FIGS. 7 to 20. FIGS. 7, 9, 11, 13, 15, 17, and 19 are schematic plan views illustrating stages in a method of manufacturing the semiconductor light emitting device 10 according to an embodiment; and FIGS. 8, 10, 12, 14, 16, 18 and 20 are cross-sectional views schematically showing regions, taken along line I-I' of FIGS. 7, 9, 11, 13, 15, 17, and 19.

Figure 7:
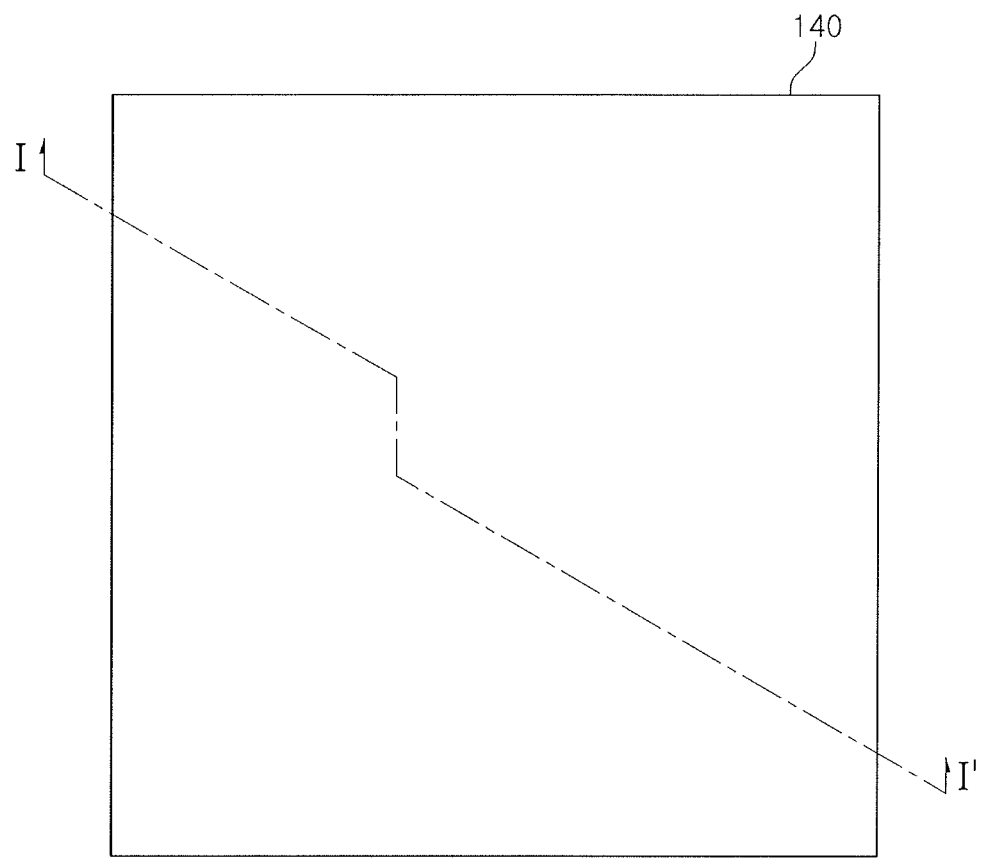
FIG. 7 through FIG. 20 illustrate views of stages in a method of manufacturing the semiconductor light emitting device of FIG. 1.
Figure 8:
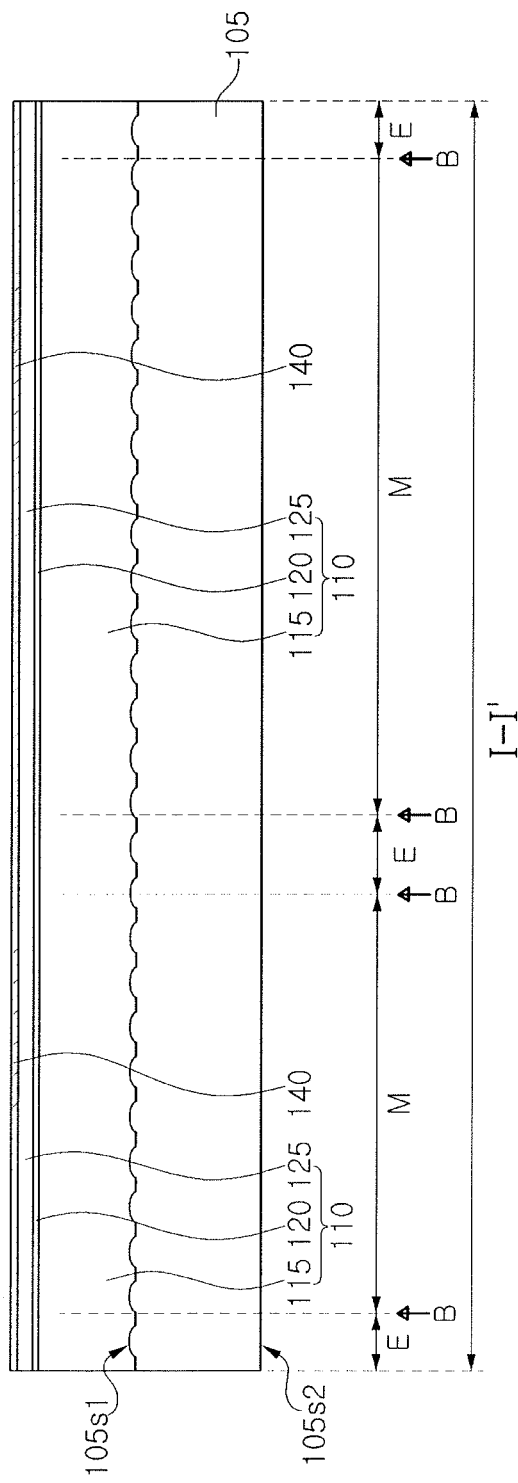

Referring to FIGS. 7 and 8, the light emitting structure 110 may be formed on the substrate 105. The substrate 105 may be formed of a material such as sapphire, Si, SiC, $MgAl_2O_4$, MgO, $LiAlO_2$, $LiGaO_2$, or GaN. The substrate 105 may have a front surface 105s1 and a rear surface 105s2 opposite to the front surface 105s1. In one example, an uneven structure may be formed on the front surface 105s1 of the substrate 105. According to an embodiment, forming the uneven structure on the front surface 105s1 of the substrate 105 may be omitted.

The light emitting structure 110 may be formed on the front surface 105s1 of the substrate 105. The light emitting structure 110 may be formed of a plurality of layers formed using a process such as metal organic chemical vapor deposition (MOCVD), hydride vapor phase epitaxy (HVPE), or molecular beam epitaxy (MBE). For example, the light emitting structure 110 may include the first conductivity-type semiconductor layer 115, the active layer 120, and the second conductivity-type semiconductor layer 125 that are sequentially formed on the front surface 105s1 of the substrate 105 along the z-direction. The first conductivity-type semiconductor layer 115 and the second conductivity-type semiconductor layer 125 may have different conductivity-types. For example, the first conductivity-type semiconductor layer 115 may have n-type conductivity and the second conductivity-type semiconductor layer 125 may have p-type conductivity.

The first transparent electrode layer 140 may be formed on the light emitting structure 110.

Figure 9:
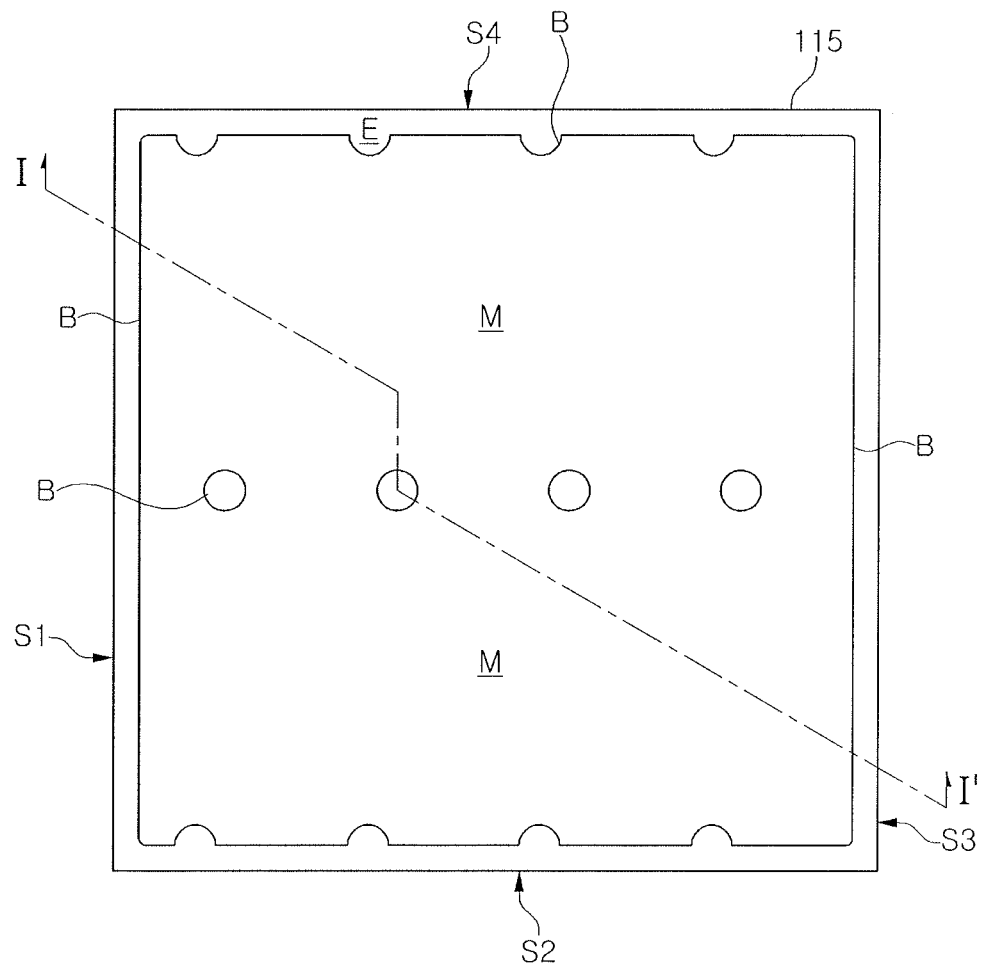
Figure 10:
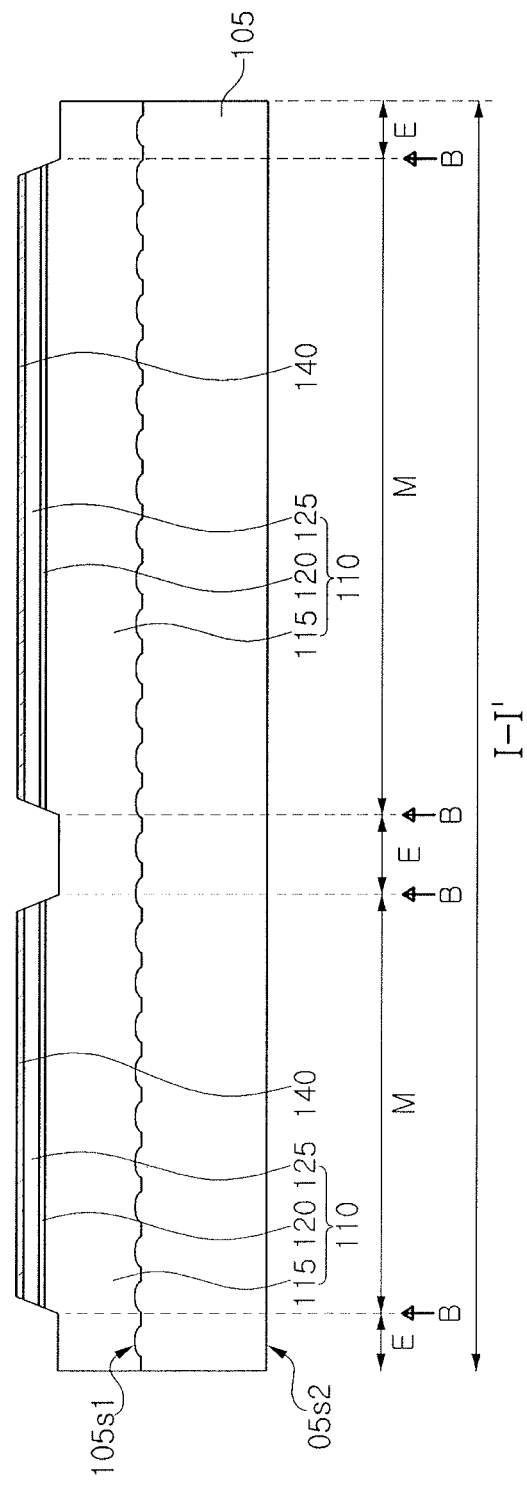

Referring to FIGS. 9 and 10, the first transparent electrode layer 140, the second conductivity-type semiconductor layer 125, the active layer 120, and the first conductivity-type semiconductor layer 115 may be partially etched. Thus, the light emitting structure 110 may include the recess region E, in which a portion of the second conductivity-type semiconductor layer 125, the active layer 120, and the first conductivity-type semiconductor layer 115 are removed, and the mesa region M therearound. The mesa region M may be defined as a region where the second conductivity-type semiconductor layer 125, the active layer 120, and the first conductivity-type semiconductor layer 115 are not etched. The mesa region M may have a relatively protruding shape compared to the recess region E along the z-direction. The recess region E may also be referred to as an etched region.

Figure 11:
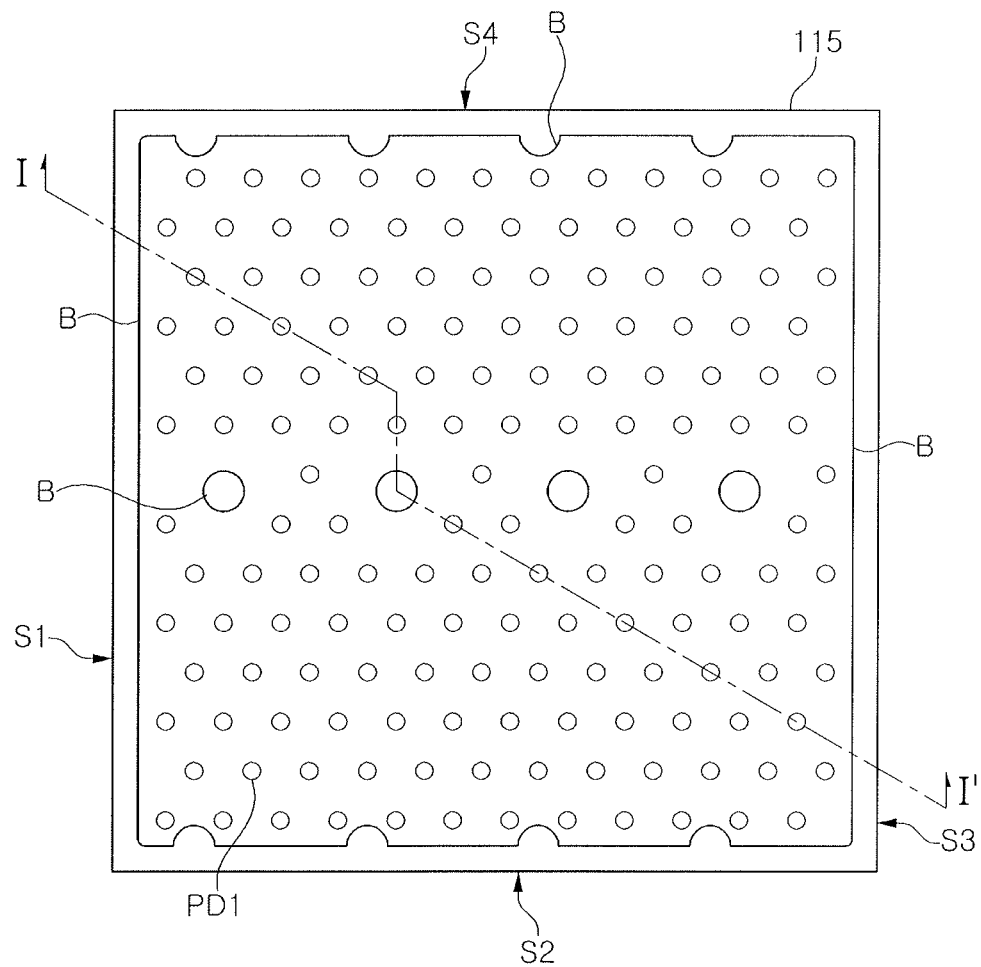
Figure 12:
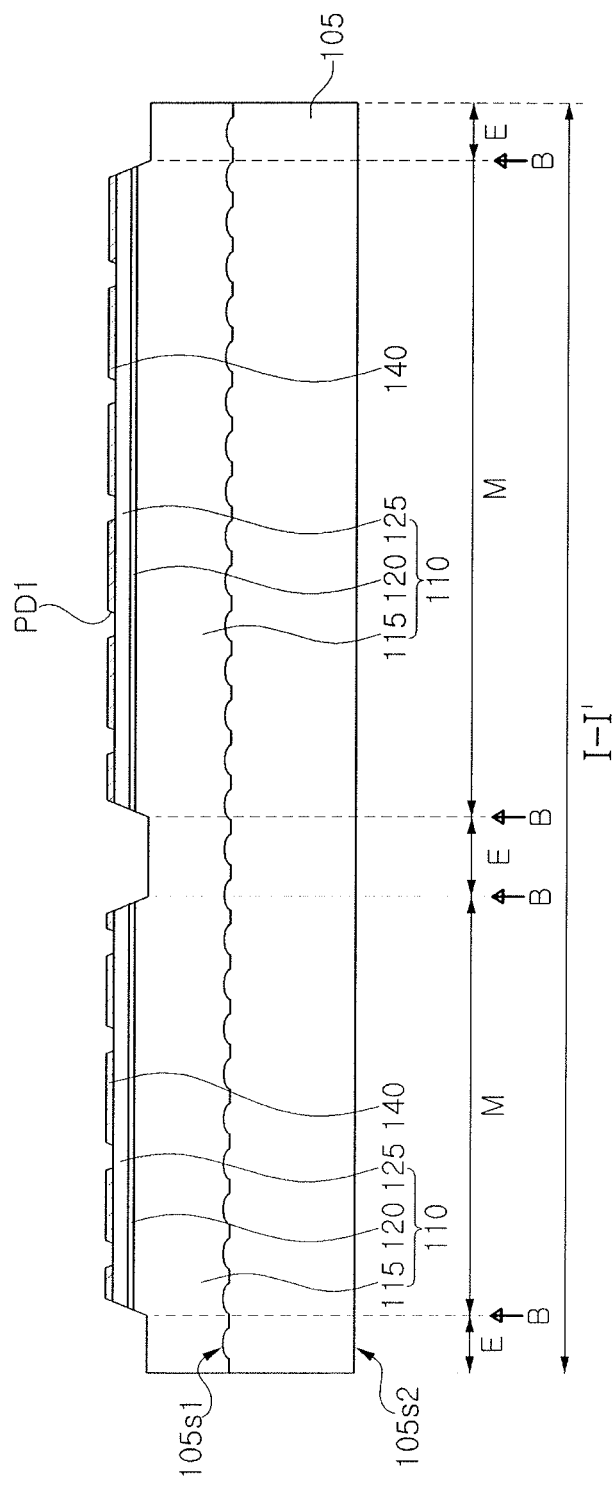

Referring to FIGS. 11 and 12, the plurality of first through-holes PD1 may be formed in the transparent electrode layer 140. The plurality of through-holes PD1 of the transparent electrode layer 140 may expose a portion of the second conductivity-type semiconductor layer 125. The plurality of first through-holes PD1 may be located in the mesa region M.

Figure 13:
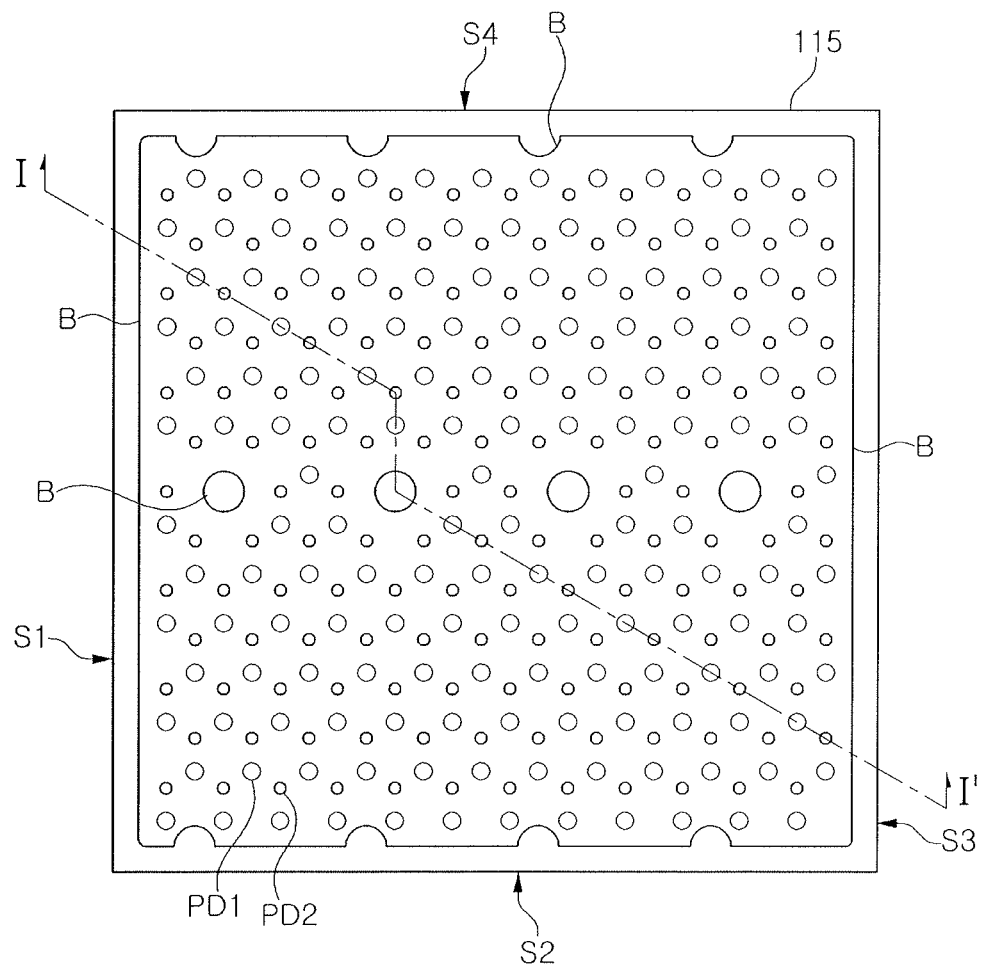
Figure 14:
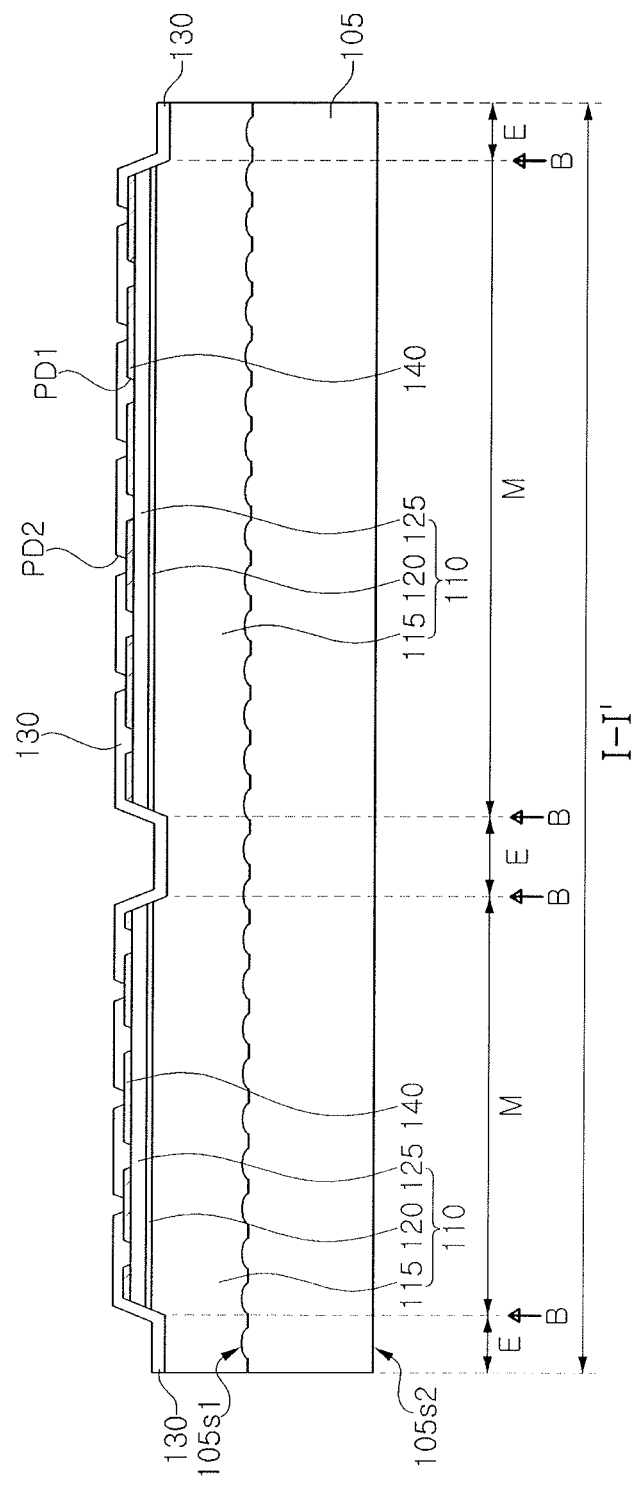

Referring to FIGS. 13 and 14, the first insulating reflective layer 130 having a plurality of the second through-holes PD2 may be formed on the transparent electrode layer 140. The plurality of second through-holes (PD2) of the first insulating reflective layer 130 expose a portion of the first transparent electrode layer 140, and may be disposed in positions in which they do not overlap the plurality of first through-holes PD1. The plurality of holes PD may be located in the mesa region M.

Figure 15:
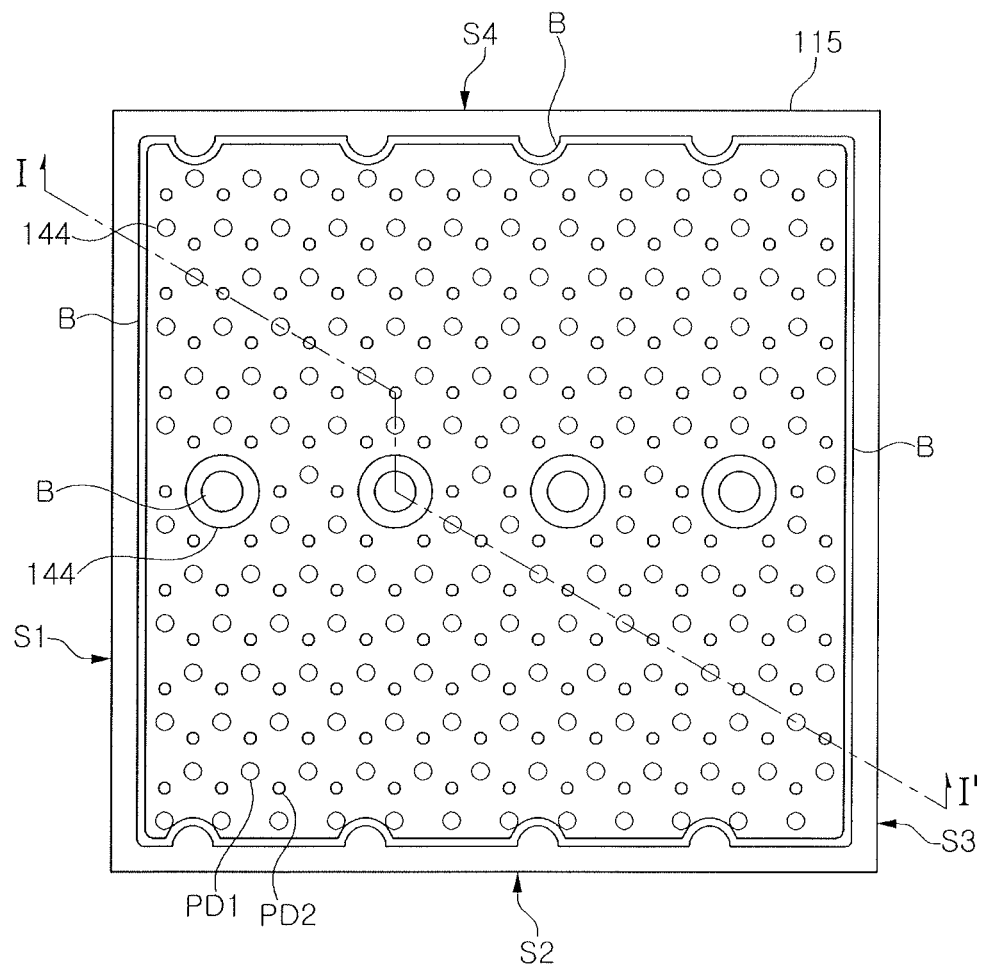
Figure 16:
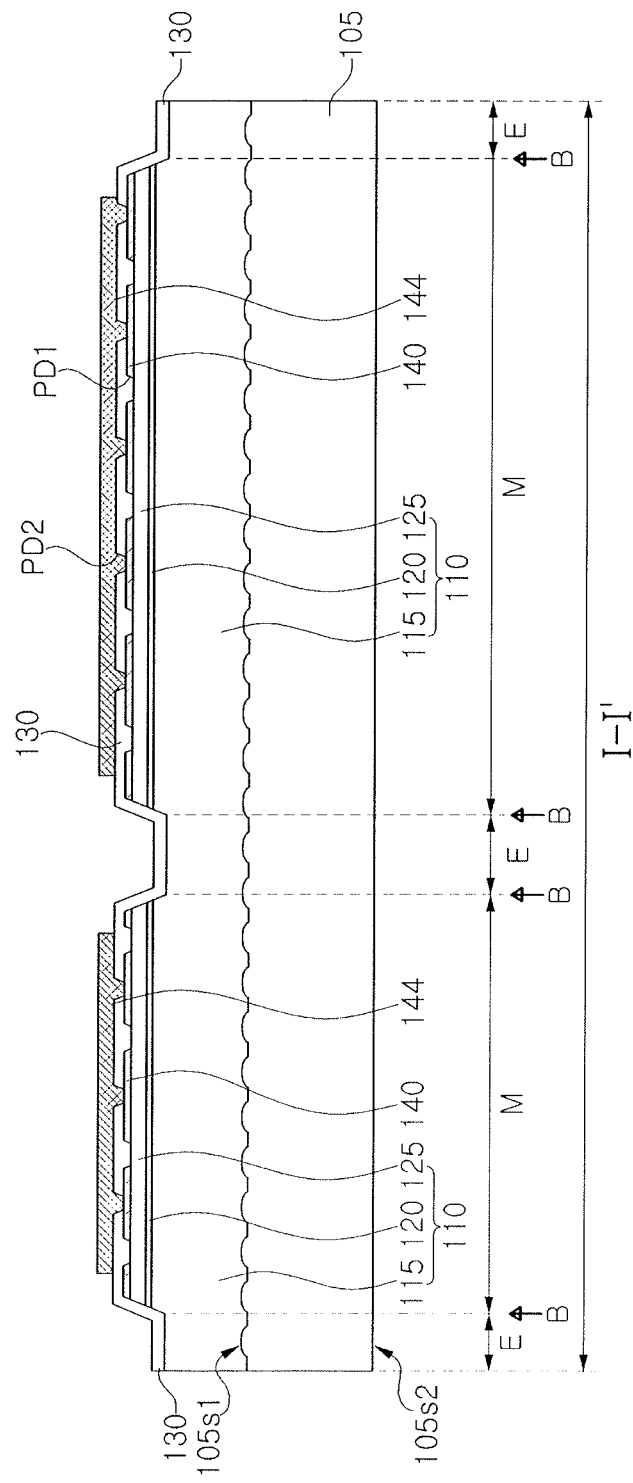

Referring to FIGS. 15 and 16, the reflective electrode layer 144 may be formed on the first insulating reflective layer 130. The reflective electrode layer 144 is formed on the mesa region M and may be formed on one region of the first insulating reflective layer 130.

Figure 17:
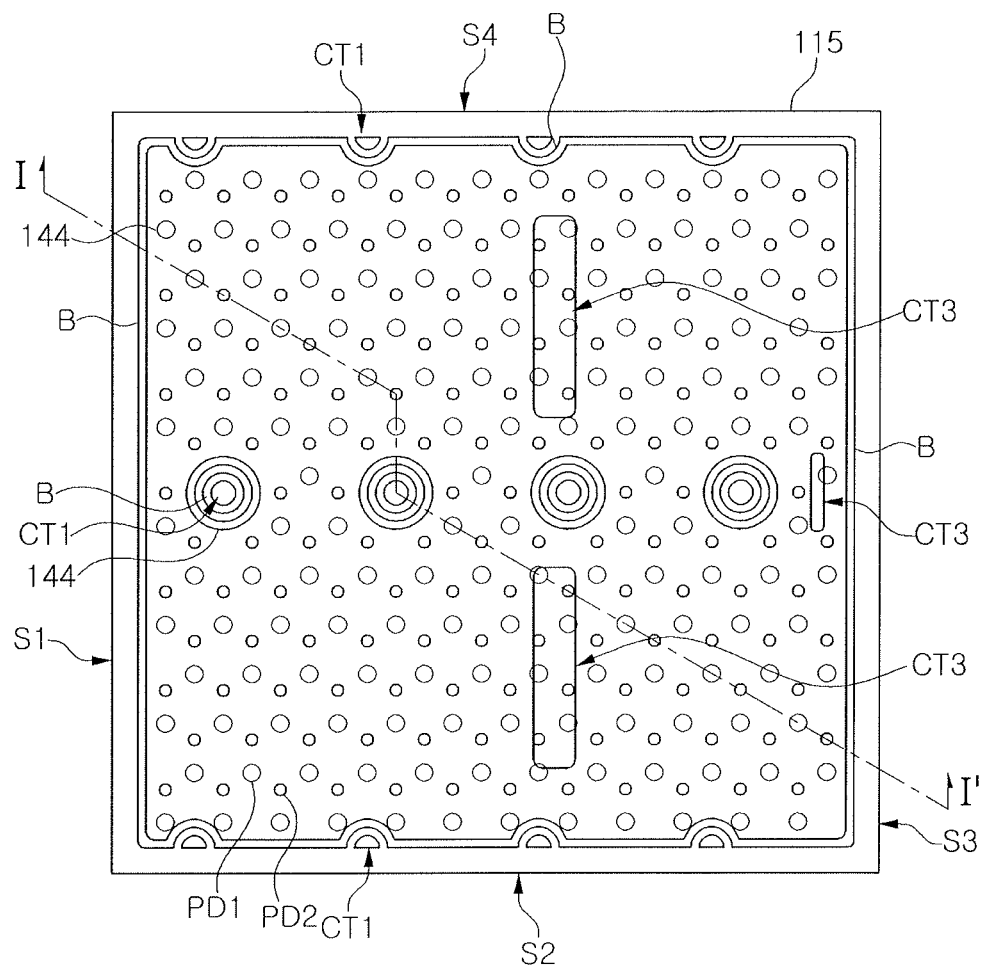
Figure 18:
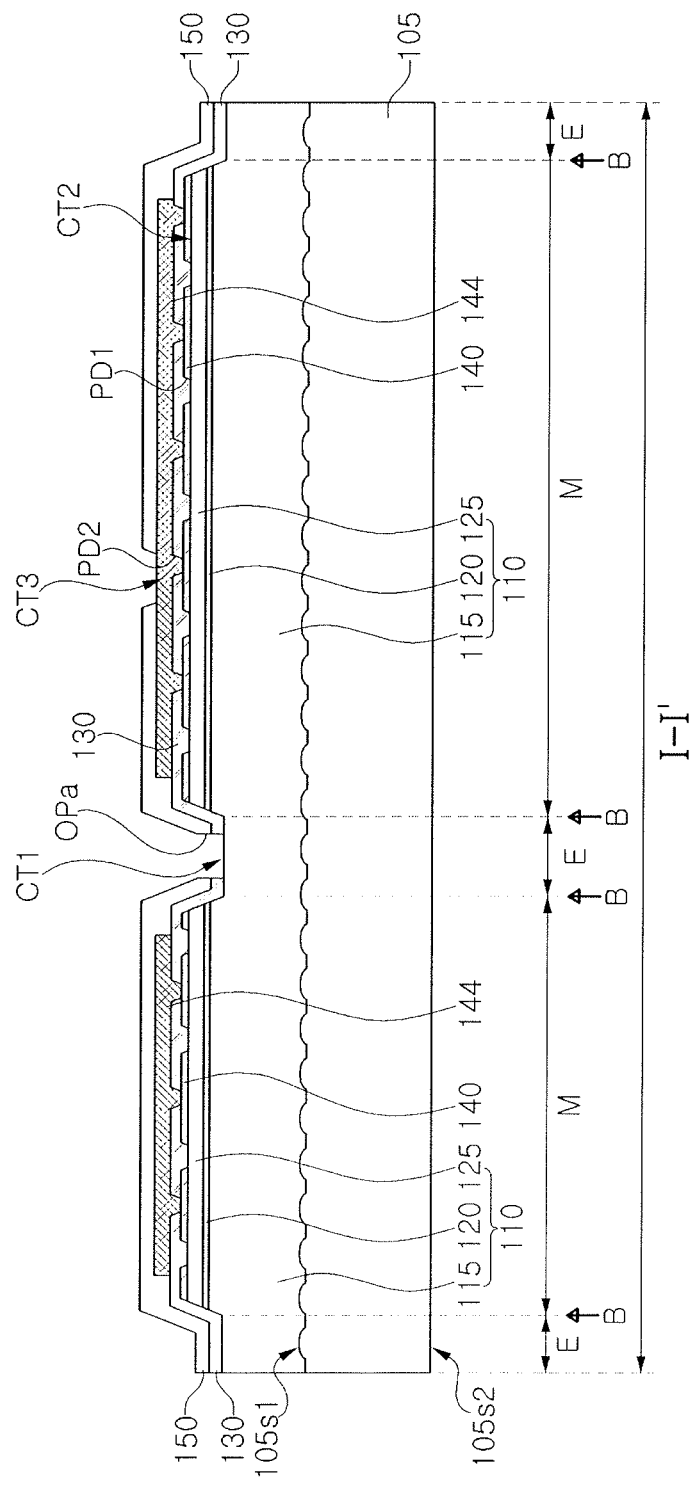

Referring to FIGS. 17 and 18, the second insulating reflective layer 150 may be formed on the reflective electrode layer 144. The second insulating reflective layer 150 may cover the reflective electrode layer 144. The first opening OPa and the second opening OPb are formed in the second insulating reflective layer 150.

The first opening OPa penetrates through the first insulating reflective layer 130 and the second insulating reflective layer 150, and exposes a portion of the first conductivity-type semiconductor layer 115 in the recess region E. The second opening OPb penetrates through the second insulating reflective layer 150 and exposes a portion of the reflective electrode layer 144 in the mesa region M. A surface of the first conductivity-type semiconductor layer 115 exposed by the first opening OPa may be referred to as the first contact region CT1 and a surface of the reflective electrode layer 144 exposed by the second opening OPb may be referred to as the third contact region CT3.

Figure 19:
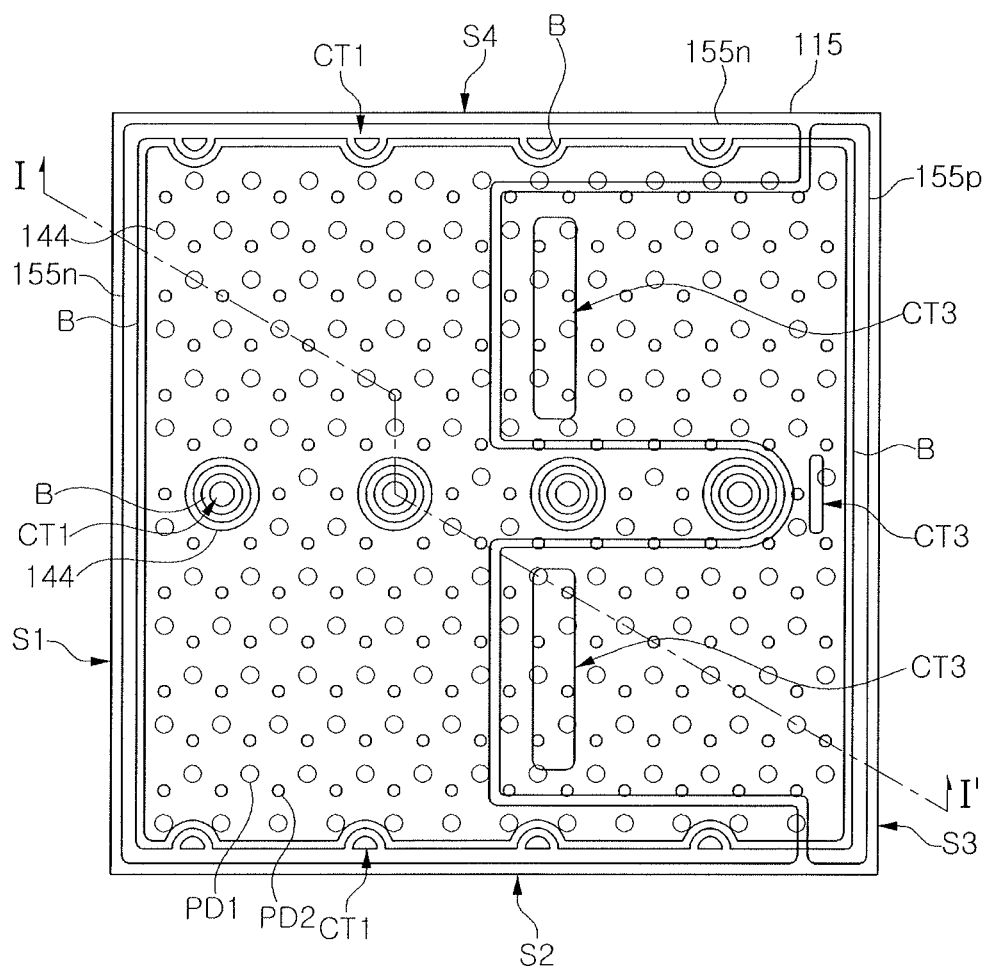
Figure 20:
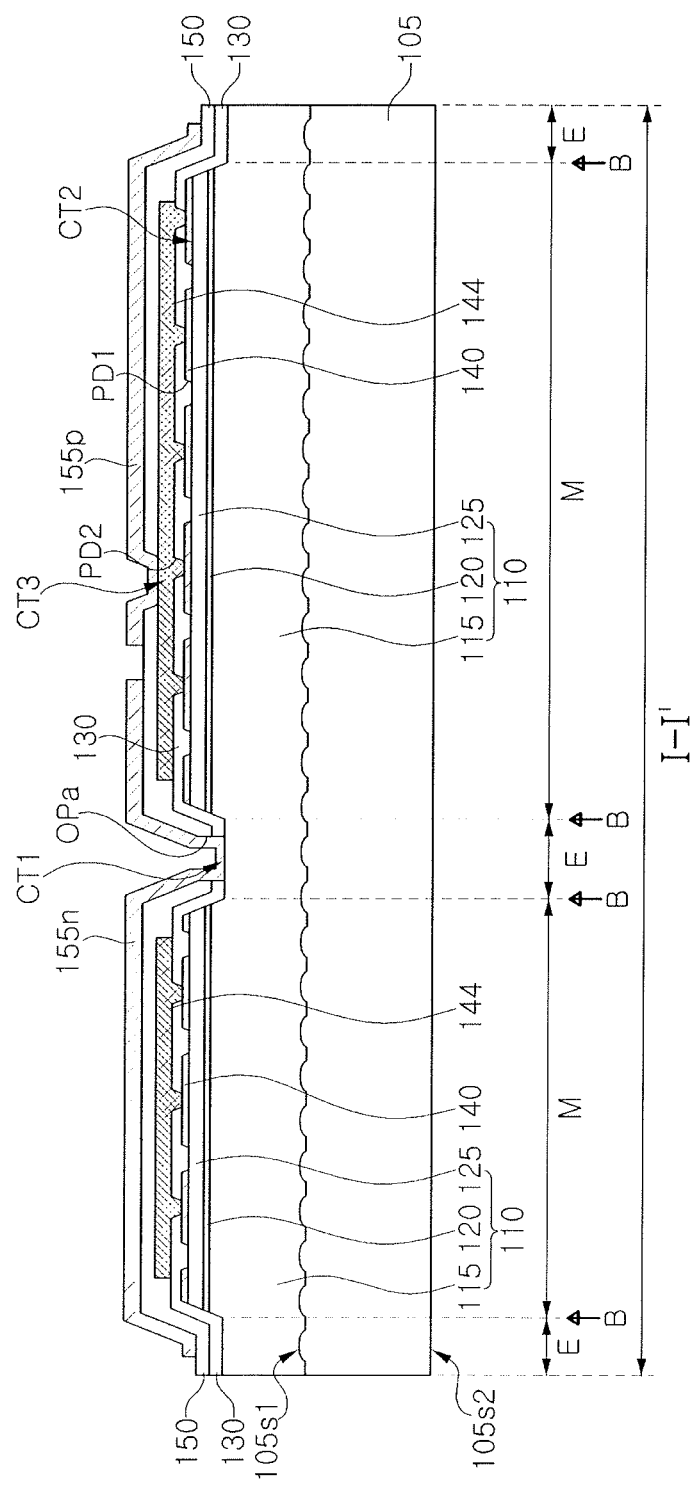

Referring to FIGS. 19 and 20, the first conductive pattern 155n and the second conductive pattern 155p may be formed on the substrate 105 having the second insulating reflective layer 150.

Forming the first conductive pattern 155n and the second conductive pattern 155p may include forming a conductive material layer on the substrate 105 having the second insulating reflective layer 150 and removing a portion of the conductive material layer, e.g., using a photo and etching process. Since the first conductive pattern 155n and the second conductive pattern 155p are formed by the same process, the first conductive pattern 155n and the second conductive pattern 155p may be formed of the same material. The first conductive pattern 155n and the second conductive pattern 155p may have the same thickness.

The first conductive pattern 155n may be electrically connected to the first contact region CT1 of the first conductivity-type semiconductor layer 115. The second conductive pattern 155p may be electrically connected to the third contact region CT3 of the reflective electrode layer 144.

Referring to FIGS. 1 and 2, the passivation layer 160 having a third opening 160a and a fourth opening 160b may be formed on the substrate 105 having the first conductive pattern 155n and the second conductive pattern 155p. The third opening 160a of the passivation layer 160 may expose a portion of the first conductive pattern 155n and the fourth opening 160b of the passivation layer 160 may expose a portion of the second conductive pattern 155p.

The portion of the first conductive pattern 155n exposed by the first opening 160a of the passivation layer 160 may be referred to as a fourth contact region CT4, and the portion of the second conductive pattern 155p exposed by the fourth opening 160b of the passivation layer 160 may be referred to as a fifth contact region CT5.

First and second electrode pads 165n and 165p may be formed on the substrate 105 having the passivation layer 160. The first electrode pad 165n may be formed on the fourth contact region CT4 of the first conductive pattern 155n, and the second electrode pad 165p may be formed on the fifth contact region CT5 of the second conductive pattern 155p. The first and second electrode pads 165n and 165p may be under bump metallurgy (UBM). In one example, the number and arrangement of the first and second electrode pads 165n and 165p may be variously modified.

The first and second solder bumps 170n and 170p may be formed on the substrate 105 having the first and second electrode pads 165n and 165p. The first solder bump 170n may be formed on the first electrode pad 165n and the second solder bump 170p may be formed on the second electrode pad 165p.

The molded portion 172 covering side surfaces of the first and second solder bumps 170n and 170p may be formed. The molded portion 172 may include light reflective powder such as $TiO_2$, $Al_2O_3$ or the like.

Figure 21:
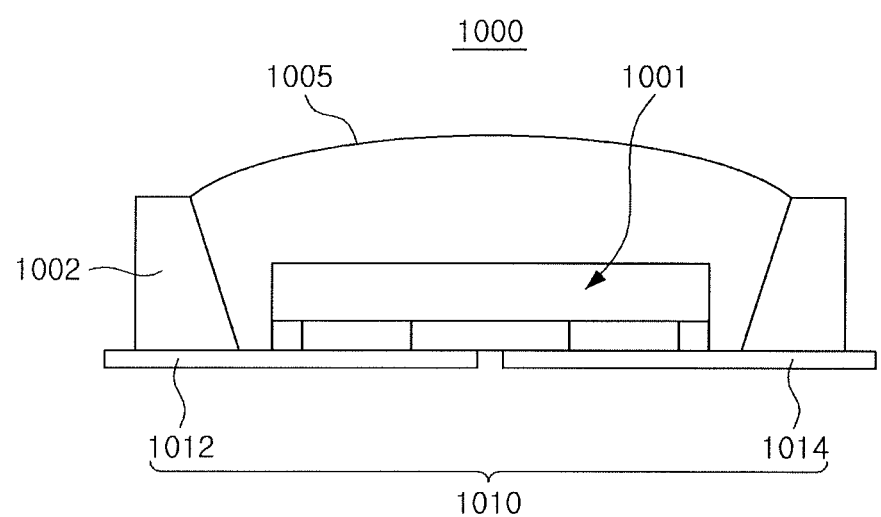
FIG. 21 illustrates a side cross-sectional view of an example of applying the semiconductor light emitting device according to the exemplary embodiment t to a semiconductor light emitting device package.

The semiconductor light emitting device 10 as described above may be commercialized as a package. Hereinafter, an example in which the semiconductor light emitting device 10 as described above is applied to a package will be described with reference to FIG. 21. FIG. 21 is a cross-sectional view schematically showing an example in which the semiconductor light emitting device according to an embodiment is applied to a package.

Referring to FIG. 21, a semiconductor light emitting device package 1000 may include a semiconductor light emitting device 1001 as a light source, a package body 1002, a pair of lead frames 1010, and an encapsulating part 1005. Here, the semiconductor light emitting device 1001 may be the semiconductor light emitting device 10 of FIG. 1, and a description thereof will be omitted.

The semiconductor light emitting device 1001 may be mounted on the lead frames 1010. The pair of lead frames 1010 may include a first lead frame 1012 and a second lead frame 1014. Referring to FIG. 1, the semiconductor light emitting device 1001 may be connected to the first lead frame 1012 and the second lead frame 1014 through the first solder pad 170n and the second solder pad 170p, respectively.

The package body 1002 may include a reflective cup to improve light reflection efficiency and light extraction efficiency. In the reflective cup, the encapsulating part 1005 formed of a light transmitting material may be formed to encapsulate the semiconductor light emitting device 1001 therein.

The encapsulating part 1005 may include a wavelength converting material. For example, the encapsulating part 1005 may include at least one fluorescent substance that is excited by light emitted from the semiconductor light emitting device 10 to emit light of a different wavelength, in a light transmitting resin. Accordingly, blue light, green light, or red light may be emitted, and emissions of white light, ultraviolet light, and the like may be controlled.

For flip chip-type LEDs among such light emitting diodes, since a conductive pattern is widely disposed over a surface to be mounted on a package substrate, light emitted from an active layer is absorbed therein. Thus, external light extraction efficiency may be lowered.

However, according to one or more embodiments, semiconductor light emitting devices may have an increased current diffusion and enhanced reflectivity, thereby improving external light extraction efficiency Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor light emitting device, comprising:
a light emitting structure having a first conductivity-type semiconductor layer, an active layer, and a second conductivity-type semiconductor layer stacked therein in a stacking direction;
a transparent electrode layer on the second conductivity-type semiconductor layer and divided into first and second regions, the transparent electrode layer having a plurality of first through-holes in the first region;
an insulating reflective layer covering the transparent electrode layer and having a plurality of second through-holes in a region overlapping the second region in the stacking direction, wherein the insulating reflective layer extends along the light emitting structure in the stacking direction; and
a reflective electrode layer on a first region of the insulating reflective layer and connected to the transparent electrode layer through the plurality of second through-holes.

2. The semiconductor light emitting device as claimed in claim 1, wherein each first through-hole of the plurality of first through-holes is larger than each second through-hole of the plurality of second through-holes.

3. The semiconductor light emitting device as claimed in claim 1, wherein the insulating reflective layer forms a distributed Bragg reflector (DBR) in which a first insulating layer having a first refractive index and a second insulating layer having a second refractive index are alternately stacked.

4. The semiconductor light emitting device as claimed in claim 1, wherein the insulating reflective layer and the reflective electrode layer form an omnidirectional reflector.

5. The semiconductor light emitting device as claimed in claim 1, wherein the plurality of first through-holes and the plurality of second through-holes are spaced apart from each other at predetermined intervals.

6. The semiconductor light emitting device as claimed in claim 1, wherein a total area of the plurality of first through-holes is larger than that of the plurality of second through-holes.

7. The semiconductor light emitting device as claimed in claim 1, wherein the light emitting structure has an etched region in which the active layer and the second conductivity-type semiconductor layer are removed, and the insulating reflective layer extends to the etched region.

8. A semiconductor light emitting device, comprising:
a light emitting structure having a first conductivity-type semiconductor layer, an active layer, and a second conductivity-type semiconductor layer stacked therein in a stacking direction;
a transparent electrode layer on the second conductivity-type semiconductor layer and divided into first and second regions, the transparent electrode layer having a plurality of first through-holes in the first region;
a first insulating reflective layer passing through the plurality of first through-holes to contact the second conductivity-type semiconductor layer and having a plurality of second through-holes in a region overlapping the second region in the stacking direction, wherein the first insulating reflective layer extends along the light emitting structure in the stacking direction; and
a reflective electrode layer covering the first insulating reflective layer and connected to the transparent electrode layer through the plurality of second through-holes.

9. The semiconductor light emitting device as claimed in claim 8, further comprising a second insulating reflective layer covering the reflective electrode layer and contacting the first insulating reflective layer.

10. The semiconductor light emitting device as claimed in claim 9, further comprising first and second conductive patterns on the second insulating reflective layer and connected to the first conductivity-type semiconductor layer and the reflective electrode layer, respectively, through the second insulating reflective layer.

11. The semiconductor light emitting device as claimed in claim 9, wherein the first and second insulating reflective layers form a distributed Bragg reflector (DBR) in which a first insulating layer having a first refractive index and a second insulating layer having a second refractive index are alternately stacked.

12. The semiconductor light emitting device as claimed in claim 8, wherein the first insulating reflective layer and the reflective electrode layer form an omnidirectional reflector.

13. A semiconductor light emitting device, comprising:
a substrate;
a light emitting structure having a first conductivity-type semiconductor layer, an active layer, and a second conductivity-type semiconductor layer stacked on the substrate in a stacking direction;
a transparent electrode layer on the second conductivity-type semiconductor layer and divided into first and second regions, the transparent electrode layer having a plurality of first through-holes in the first region;
a first insulating reflective layer penetrating through the plurality of first through-holes to contact the second conductivity-type semiconductor layer and having a plurality of second through-holes in a region overlapping the second region along the stacking direction;
a reflective electrode layer covering the first insulating reflective layer and connected to the transparent electrode layer through the plurality of second through-holes;
a second insulating reflective layer covering the transparent electrode layer and the reflective electrode layer; and
first and second conductive patterns on the second insulating reflective layer and connected to the first conductivity-type semiconductor layer and the reflective electrode layer, respectively, through the second insulating reflective layer.

14. The semiconductor light emitting device as claimed in claim 13, wherein:
the light emitting structure includes a plurality of light emitting structures, and
the plurality of light emitting structures share the substrate and are separated by a region in which the first conductivity-type semiconductor layer is removed and are electrically connected to each other in series.

15. The semiconductor light emitting device as claimed in claim 14, wherein the plurality of light emitting structures are connected to each other in series by an interconnecting portion that connects the first or second conductive pattern of a first light emitting structure of the plurality of light emitting structures with a corresponding pattern of a second light emitting structure adjacent to the first light emitting structure.

16. The semiconductor light emitting device as claimed in claim 13, wherein the first and second insulating reflective layers are formed of the same material.

17. The semiconductor light emitting device as claimed in claim 13, further comprising:

first and second solder bumps respectively in bonding regions of the first and second conductive patterns; and a molded portion covering side surfaces of the first and second solder bumps.

18. The semiconductor light emitting device as claimed in claim 17, wherein the molded portion includes a reflective powder.

19. The semiconductor light emitting device as claimed in claim 13, wherein the first insulating reflective layer extends along the light emitting structure in the stacking direction.

20. The semiconductor light emitting device as claimed in claim 13, wherein the second insulating reflective layer extends along the light emitting structure in the stacking direction.

* * * * *